(12) United States Patent
Xue et al.

(10) Patent No.: US 11,423,823 B2
(45) Date of Patent: Aug. 23, 2022

(54) SHIFT REGISTER AND DRIVING METHOD THEREOF, GATE DRIVING CIRCUIT AND DISPLAY DEVICE CAPABLING RESET THE OUTPUT TERMINAL

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Wei Xue, Beijing (CN); Hongmin Li, Beijing (CN); Yue Shi, Beijing (CN); Qinghua Jiang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/255,665

(22) PCT Filed: Jun. 2, 2020

(86) PCT No.: PCT/CN2020/093833
§ 371 (c)(1),
(2) Date: Dec. 23, 2020

(87) PCT Pub. No.: WO2020/244489
PCT Pub. Date: Dec. 10, 2020

(65) Prior Publication Data
US 2021/0272506 A1  Sep. 2, 2021

(30) Foreign Application Priority Data
Jun. 4, 2019 (CN) .......................... 201910482021.4

(51) Int. Cl.
*G09G 5/00* (2006.01)
*G09G 3/20* (2006.01)
*G11C 19/28* (2006.01)

(52) U.S. Cl.
CPC ............. *G09G 3/2092* (2013.01); *G09G 3/20* (2013.01); *G09G 2300/0426* (2013.01);
(Continued)

(58) Field of Classification Search
CPC ......... G09G 3/2092; G09G 2300/0426; G09G 2310/0286; G09G 2310/061; G09G 2310/08; G09G 3/20; G11C 19/28
See application file for complete search history.

(56) References Cited

U.S. PATENT DOCUMENTS

2007/0247932 A1* 10/2007 Tobita .................. G09G 3/3677
365/189.12
2007/0274433 A1* 11/2007 Tobita .................. G09G 3/3677
377/64
(Continued)

FOREIGN PATENT DOCUMENTS

CN          102222477 A      10/2011
CN          104485134 A      4/2015
(Continued)

OTHER PUBLICATIONS

China Patent Office, First Office Action dated Dec. 24, 2020, for corresponding Chinese application 201910482021.4.

*Primary Examiner* — Adam J Snyder
(74) *Attorney, Agent, or Firm* — Houtteman Law LLC (57) ABSTRACT

The present disclosure provides a shift register including: a pre-charge reset circuit and an output circuit, the pre-charge reset circuit is configured to write, in a pre-charge stage, an input signal in an active level state into the pull-up node in response to the control of a first control signal, and write, in a reset stage, an input signal in an inactive level state into the
(Continued)

pull-up node in response to the control of a second control signal; the output circuit is configured to write, in an output stage, a clock signal in an active level state into a signal output terminal in response to the control of an electric signal in an active level state at the pull-up node, and write, in the reset stage, a clock signal in an inactive level state into the signal output terminal in response to the control of the second control signal.

11 Claims, 9 Drawing Sheets

(52) U.S. Cl.
CPC .............. *G09G 2310/0286* (2013.01); *G09G 2310/061* (2013.01); *G09G 2310/08* (2013.01); *G11C 19/28* (2013.01)

(56) References Cited

U.S. PATENT DOCUMENTS

| | | | | |
|---|---|---|---|---|
| 2008/0101529 | A1* | 5/2008 | Tobita | .................. G09G 3/3677 377/64 |
| 2008/0187089 | A1* | 8/2008 | Miyayama | .............. G11C 19/28 377/79 |
| 2009/0303211 | A1* | 12/2009 | Hu | .......................... G11C 19/28 345/204 |
| 2010/0134396 | A1* | 6/2010 | Umezaki | .............. G09G 3/3266 345/92 |
| 2014/0064437 | A1* | 3/2014 | Qi | ........................ G09G 3/3674 377/64 |
| 2018/0366208 | A1 | 12/2018 | Chan | |
| 2019/0371224 | A1 | 12/2019 | Tao et al. | |

FOREIGN PATENT DOCUMENTS

| | | |
|---|---|---|
| CN | 105810167 U | 7/2016 |
| CN | 105931595 A | 9/2016 |
| CN | 108777128 A | 11/2018 |
| CN | 109448630 A | 3/2019 |
| CN | 110232887 A | 9/2019 |

* cited by examiner

SHIFT REGISTER AND DRIVING METHOD THEREOF, GATE DRIVING CIRCUIT AND DISPLAY DEVICE CAPABLING RESET THE OUTPUT TERMINAL

CROSS REFERENCE TO RELATED APPLICATIONS

This application claims priority to Chinese patent application No. 201910482021.4 filed with the Chinese Intellectual Property Office on Jun. 4, 2019, the entire contents of which are incorporated herein by reference.

TECHNICAL FIELD

The present disclosure relates to the field of display technology, and in particular, to a shift register and a driving method thereof, a gate driving circuit, and a display device.

BACKGROUND

In the related art, a Gate Driver on Array (GOA) technology is used to integrate a thin film transistor (TFT) gate switch circuit on an array substrate of a display panel to perform a scan driving for the display panel, so that a gate driver IC (Integrated Circuit) can be omitted. A GOA circuit includes a plurality of shift registers which are cascaded. After the shift register outputs a driving signal in an active level state, a pull-up node in the shift register and a signal output terminal of the shift register need to be reset.

SUMMARY

An embodiment of the present disclosure provides a shift register, including: a pre-charge reset circuit and an output circuit which are electrically coupled to a pull-up node; the pre-charge reset circuit is electrically coupled with a signal input terminal, a first control signal terminal and a second control signal terminal, and is configured to write, in a pre-charge stage, an input signal in an active level state provided by the signal input terminal into the pull-up node in response to the control of a first control signal provided by the first control signal terminal, and write, in a reset stage, an input signal in an inactive level state provided by the signal input terminal into the pull-up node in response to the control of a second control signal provided by the second control signal terminal; the output circuit is electrically coupled with a signal output terminal, a clock signal terminal and the second control signal terminal, and is configured to write, in an output stage, a clock signal in an active level state provided by the clock signal terminal into the signal output terminal in response to the control of an electric signal in an active level state at the pull-up node, and write, in the reset stage, a clock signal in an inactive level state provided by the clock signal terminal into the signal output terminal in response to the control of the second control signal.

In some implementations, the pre-charge reset circuit includes: a first transistor and a second transistor; a control electrode of the first transistor is electrically coupled with the first control signal terminal, a first electrode of the first transistor is electrically coupled with the signal input terminal, and a second electrode of the first transistor is electrically coupled with the pull-up node; a control electrode of the second transistor is electrically coupled with the second control signal terminal, a first electrode of the second transistor is electrically coupled with the pull-up node, and a second electrode of the second transistor is electrically coupled with the signal input terminal.

In some implementations, the pre-charge reset circuit includes: a first transistor, a second transistor, and a sixth transistor; a control electrode of the first transistor is electrically coupled with the first control signal terminal, a first electrode of the first transistor is electrically coupled with the signal input terminal, and a second electrode of the first transistor is electrically coupled with the pull-up node; a control electrode of the second transistor is electrically coupled with the second control signal terminal, a first electrode of the second transistor is electrically coupled with the pull-up node, and a second electrode of the second transistor is electrically coupled with a first electrode of the sixth transistor; a control electrode of the sixth transistor is electrically coupled with a third control signal terminal, and a second electrode of the sixth transistor is electrically coupled with the signal input terminal.

In some implementations, the output circuit includes: a third transistor, a fourth transistor and a first capacitor, a control electrode of the third transistor is electrically coupled with the pull-up node, a first electrode of the third transistor is electrically coupled with the clock signal terminal, and a second electrode of the third transistor is electrically coupled with the signal output terminal; a control electrode of the fourth transistor is electrically coupled with the second control signal terminal, a first electrode of the fourth transistor is electrically coupled with the clock signal terminal, and a second electrode of the fourth transistor is electrically coupled with the signal output terminal; a first terminal of the first capacitor is electrically coupled with the signal output terminal, and a second terminal of the first capacitor is electrically coupled with the pull-up node.

In some implementations, the shift register further includes a pull-up prevention circuit, the pull-up prevention circuit is electrically coupled with the clock signal terminal, the pull-up node and the signal output terminal and is configured to electrically couple, in the output stage, the pull-up node with the signal output terminal in response to the control of an electric signal of the clock signal terminal in an active level state.

In some implementations, the pull-up prevention circuit includes a fifth transistor, where a control electrode of the fifth transistor is electrically coupled with the clock signal terminal, a first electrode of the fifth transistor is electrically coupled with the pull-up node, and a second electrode of the fifth transistor is electrically coupled with the signal output terminal.

In some implementations, all transistors in the shift register are N-type transistors; or all transistors in the shift register are P-type transistors.

An embodiment of the present disclosure further provides a gate driving circuit, including: a plurality of shift registers which are cascaded, each of the shift registers adopts the above shift register, where for any one of the shift registers rather than the shift register of the first stage, the signal input terminal of the shift register is electrically coupled with the signal output terminal of a shift register of a previous stage.

In some implementations, when the pre-charge reset circuit in the shift register includes the first transistor and the second transistor, the gate driving circuit has a first clock signal line and a second clock signal line, and where for any one of the shift registers, the first control signal terminal of the shift register is electrically coupled with the signal input terminal of the shift register; for any one of shift registers other than the shift register of the last stage, the second control signal terminal of the shift register is electrically coupled with the signal output terminal of a shift register of a next stage; for any one of shift registers of odd-numbered stages, the clock signal terminal of the shift register is electrically coupled with the first clock signal line; for any one of shift registers of even-numbered stages, the clock signal terminal of the shift register is electrically coupled with the second clock signal line.

In some implementations, when the pre-charge reset circuit in the shift register includes the first transistor, the second transistor and the sixth transistor, the gate driving circuit has a first clock signal line, a second clock signal line, a third clock signal line, and a fourth clock signal line, and where for any one of shift registers other than the shift register of the first stage and the shift register of the second stage, the first control signal terminal of the shift register is electrically coupled with the pull-up node in a shift register that is of two stage prior to the shift register; for any one of shift registers of $(4n-3)^{th}$ stages, the second control signal terminal of the shift register is electrically coupled to the first clock signal line, the third control signal terminal of the shift register is electrically coupled to the second clock signal line, and the clock signal terminal of the shift register is electrically coupled with the third clock signal line; for any one of shift registers of $(4n-2)^{th}$ stages, the second control signal terminal of the shift register is electrically coupled with the second clock signal line, the third control signal terminal of the shift register is electrically coupled with the third clock signal line, and the clock signal terminal of the shift register is electrically coupled with the fourth clock signal line; for any one of shift registers of $(4n-1)^{th}$ stages, the second control signal terminal of the shift register is electrically coupled with the third clock signal line, the third control signal terminal of the shift register is electrically coupled with the fourth clock signal line, and the clock signal terminal of the shift register is electrically coupled with the first clock signal line; for any one of shift registers of $(4n)^{th}$ stages, the second control signal terminal of the shift register is electrically coupled to the fourth clock signal line, the third control signal terminal of the shift register is electrically coupled to the first clock signal line, and the clock signal terminal of the shift register is electrically coupled with the second clock signal line.

An embodiment of the present disclosure further provides a display device, including the above gate driving circuit.

An embodiment of the present disclosure further provides a gate driving method based on the above shift register, the gate driving method includes: in a pre-charge stage, the pre-charge reset circuit writes an input signal in an active level state provided by the signal input terminal into the pull-up node in response to the control of a first control signal provided by the first control signal terminal; in an output stage, the output circuit writes a clock signal in an active level state provided by the clock signal terminal into the signal output terminal in response to the control of an electric signal in an active level state at the pull-up node; and in a reset stage, the pre-charge reset circuit writes an input signal in an inactive level state provided by the signal input terminal into the pull-up node in response to the control of a second control signal provided by the second control signal terminal; and the output circuit writes a clock signal in an inactive level state provided by the clock signal terminal into the signal output terminal in response to the control of the second control signal.

DESCRIPTION OF EMBODIMENTS

In order to make those skilled in the art better understand technical solutions of the present disclosure, a shift register and a driving method thereof, a gate driving circuit and a display device provided in the present disclosure are described in detail below with reference to the accompanying drawings.

The transistors in the present disclosure may be thin film transistors, field effect transistors or other switching devices having the same characteristics. Each transistor generally includes three electrodes: a gate, a source and a drain, the source and the drain in the transistor being symmetrical in structure, and are interchangeable as required. In the present disclosure, a control electrode refers to the gate of the transistor, and one of a first electrode and a second electrode is the source and the other is the drain.

Further, transistors can be classified into N-type transistors and P-type transistors according to transistor characteristics; in a case where the transistor is an N-type transistor, the transistor is turned on under a high level voltage, and is turned off under a low level voltage; in a case where the transistor is a P-type transistor, the transistor is turned on under a low level voltage and is turned off under a high level voltage.

In the present disclosure, a signal in an "active level state" refers to a signal in a voltage state in which a corresponding transistor can be controlled to be turned on by the signal, and a signal in an "inactive level state" refers to a signal in a voltage state in which a corresponding transistor can be controlled to be turned off by the signal; therefore, in a case where the transistor is an N-type transistor, the active level state refers to a high level state, and the inactive level state refers to a low level state; in a case where the transistor is a P-type transistor, the active state refers to a low level state, and the inactive state refers to a high level state. In addition, resetting a certain node/electrode/terminal in the present disclosure means setting an electrical signal at the node/electrode/terminal in an inactive level state.

In the following embodiments, an example in which all transistors in a pixel circuit are N-type transistors will be described. It should be understood by those skilled in the art that the case where all transistors in the pixel circuit are N-type transistors is only an exemplary embodiment in the present disclosure, and in such case, all transistors in the pixel circuit can be simultaneously manufactured based on a same manufacturing process, and this does not limit the technical solution of the present disclosure. Similarly, the case where all the transistors in the pixel circuit of the present disclosure are P-type transistors is also an embodiment in the present disclosure (this case is not exemplarily described).

In the related art, in order to implement the resetting, a reset power supply capable of providing a voltage signal (reset voltage) in an inactive level state needs to be provided, and in order to introduce the reset voltage provided by the reset power supply into the shift register, a corresponding signal wire needs to be provided, and the signal wire may occupy a certain frame area, which is not favorable for narrow-bezel design.

Figure 1:
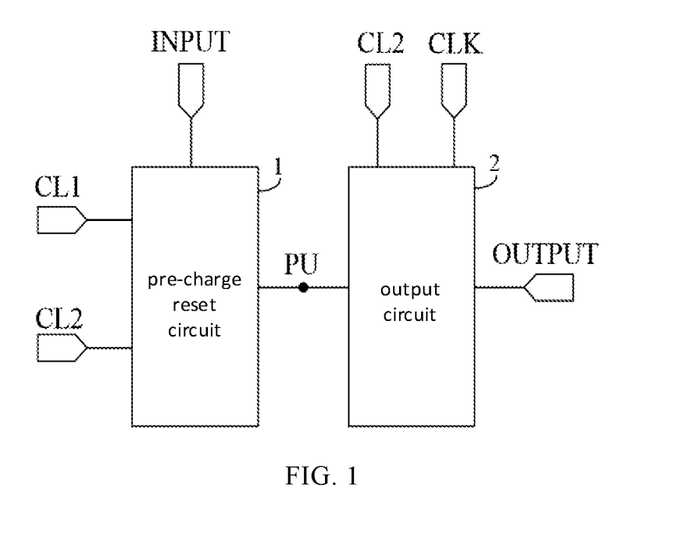
FIG. 1 is a schematic circuit diagram of a shift register according to an embodiment of the present disclosure.

FIG. 1 is a schematic circuit structure diagram of a shift register according to an embodiment of the present disclosure, as shown in FIG. 1, the shift register includes: a pre-charge reset circuit 1 and an output circuit 2, which are electrically coupled to a pull-up node PU.

The pre-charge reset circuit 1 is electrically coupled with a signal input terminal INPUT, a first control signal terminal CL1 and a second control signal terminal CL2; the pre-charge reset circuit 1 is configured to write an input signal provided by the signal input terminal INPUT in an active level state to the pull-up node PU during a pre-charge stage in response to the control of a first control signal provided by the first control signal terminal CL1, and to write an input signal provided by the signal input terminal INPUT in an inactive level state to the pull-up node PU during a reset stage in response to the control of a second control signal provided by the second control signal terminal CL2.

The output circuit 2 is electrically coupled with a signal output terminal OUTPUT, a clock signal terminal CLK and the second control signal terminal CL2; the output circuit 2 is configured to write a clock signal in an active level state provided by the clock signal terminal CLK to the signal output terminal OUTPUT in response to the control of an electrical signal in an active level state at the pull-up node PU in an output stage, and to write a clock signal in an inactive level state provided by the clock signal terminal CLK to the signal output terminal OUTPUT in response to the control of the second control signal in the reset stage.

In the present disclosure, during the pre-charge stage, the pre-charge reset circuit 1, in response to the control of the first control signal, writes the input signal in the active level state provided by the signal input terminal INPUT to the pull-up node PU; in the output stage, the output circuit 2 writes the clock signal in the active level state provided by the clock signal terminal CLK into the signal output terminal OUTPUT in response to the control of the electrical signal in the active level state at the pull-up node PU, so as to output a driving signal in the active level state; in the reset stage, the pre-charge reset circuit 1 writes, in response to the control of the second control signal, the input signal in the inactive level state provided by the signal input terminal INPUT to the pull-up node PU, so as to reset the pull-up node PU; meanwhile, the output circuit 2 writes, in response to the control of the second control signal, the clock signal in the inactive level state provided by the clock signal terminal CLK to the signal output terminal OUTPUT to perform a reset process on the signal output terminal OUTPUT.

As can be seen from the above, according to the shift register provided by the present disclosure, the input signal in the inactive level state provided by the signal input terminal INPUT and the clock signal in the inactive level state provided by the clock signal terminal CLK are used to perform the reset process on the pull-up node PU and the signal output terminal OUTPUT respectively, so that the reset power supply and the corresponding signal wire do not need to be provided for the shift register, thereby effectively reducing the frame area and facilitating an implementation of a narrow bezel.

Figure 2:
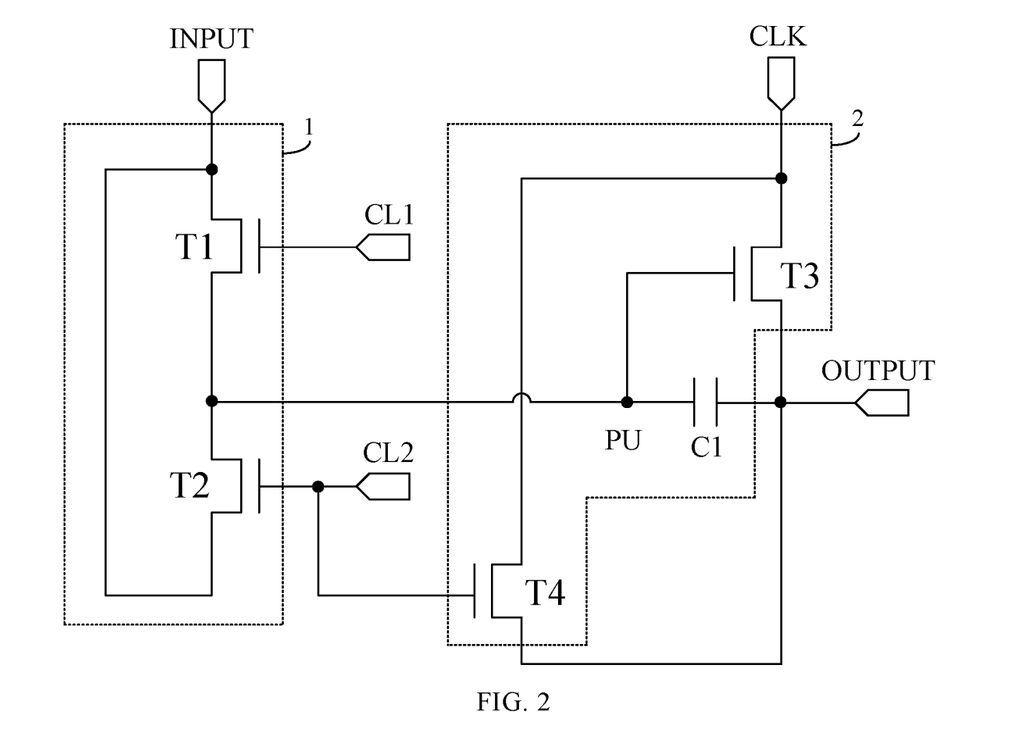
FIG. 2 is another schematic circuit diagram of a shift register according to an embodiment of the present disclosure.

FIG. 2 is another schematic circuit diagram of a shift register provided in an embodiment of the present disclosure, and as shown in FIG. 2, the shift register shown in FIG. 2 is an alternative embodiment based on the shift register shown in FIG. 1.

In some implementations, the pre-charge reset circuit 1 includes: a first transistor T1 and a second transistor T2; a control electrode of the first transistor T1 is electrically coupled to the first control signal terminal CL1, a first electrode of the first transistor T1 is electrically coupled to the signal input terminal INPUT, and a second electrode of the first transistor T1 is electrically coupled to the pull-up node PU; a control electrode of the second transistor T2 is electrically coupled to the second control signal terminal CL2, a first electrode of the second transistor T2 is electrically coupled to the pull-up node PU, and a second electrode of the second transistor T2 is electrically coupled to the signal input terminal INPUT.

In some implementations, the output circuit 2 includes: a third transistor T3, a fourth transistor T4, and a first capacitor C1; a control electrode of the third transistor T3 is electrically coupled to the pull-up node PU, a first electrode of the third transistor T3 is electrically coupled to the clock signal terminal CLK, and a second electrode of the third transistor T3 is electrically coupled to the signal output terminal OUTPUT; a control electrode of the fourth transistor T4 is electrically coupled to the second control signal terminal CL2, a first electrode of the fourth transistor T4 is electrically coupled to the clock signal terminal CLK, and a second electrode of the fourth transistor T4 is electrically coupled to the signal output terminal OUTPUT. A first terminal of the first capacitor C1 is electrically coupled to the signal output terminal OUTPUT, and a second terminal of the first capacitor C1 is electrically coupled to the pull-up node PU.

Figure 3:
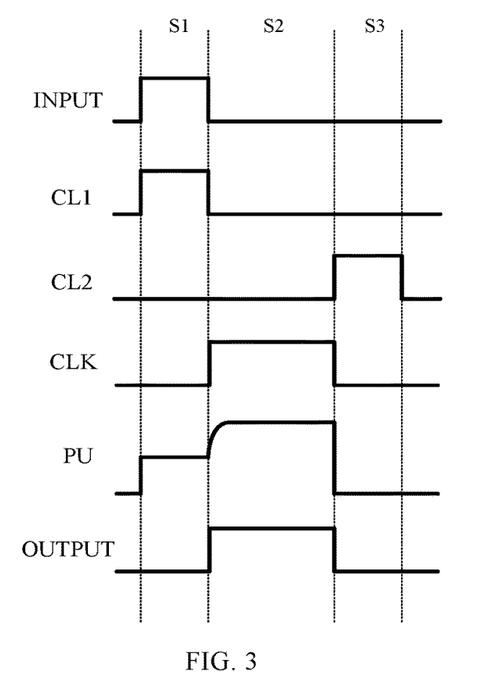
FIG. 3 is a timing diagram illustrating operation of the shift register shown in FIG. 2.

An operation of the shift register shown in FIG. 2 will be described in detail with reference to the accompanying drawings. FIG. 3 is a timing diagram illustrating an operation of the shift register shown in FIG. 2, and as shown in FIG. 3, an operation cycle of the shift register includes the following three stages: a pre-charge stage S1, an output stage S2, and a reset stage S3.

During the pre-charge stage S1, the input signal provided by the signal input terminal INPUT is in a high level state, the first control signal provided by the first control signal terminal CL1 is in a high level state, the second control signal provided by the second control signal terminal CL2 is in a low level state, and the clock signal provided by the clock signal terminal CLK is in a low level state. At this time, the first transistor T1 and the third transistor T3 are turned on, and the second transistor T2 and the fourth transistor T4 are all turned off.

The first transistor T1 is turned on, the input signal in the high level state is written into the pull-up node PU through the first transistor, the electrical signal at the pull-up node PU is in the high level state, the third transistor T3 is turned on, the clock signal in the low level state is written into the signal output terminal OUTPUT through the third transistor T3, and the signal output terminal OUTPUT outputs a low level signal.

During the output stage S2, the input signal provided by the signal input terminal INPUT is in a low level state, the first control signal provided by the first control signal terminal CL1 is in a low level state, the second control signal provided by the second control signal terminal CL2 is in a low level state, and the clock signal provided by the clock signal terminal CLK is in a high level state. At this time, the third transistor T3 is turned on, and the first transistor T1, the second transistor T2, and the fourth transistor T4 are all turned off.

Since the first transistor T1 and the second transistor T2 are both turned off, the pull-up node PU is in a floating state, the electrical signal at the pull-up node PU maintains the high level state, the third transistor T3 maintains being turned on, at this time, the clock signal in the high level state is written into the signal output terminal OUTPUT through the third transistor T3, and the signal output terminal OUTPUT outputs a high level signal. It should be noted that, at the time when the signal output terminal OUTPUT is switched from outputting a low level signal to outputting a high level signal, under a bootstrap effect of the first capacitor C1, a voltage of the electrical signal at the pull-up node PU is pulled up to a higher level.

In the reset stage S3, the input signal provided by the signal input terminal INPUT is in a low level state, the first control signal provided by the first control signal terminal CL1 is in a low level state, the second control signal provided by the second control signal terminal CL2 is in a high level state, and the clock signal provided by the clock signal terminal CLK is in a low level state. At this time, the second transistor T2 and the fourth transistor T4 are turned on, and the first transistor T1 and the third transistor T3 are both turned off.

Since the second transistor T2 is turned on, the input signal in the low level state is written to the pull-up node PU through the second transistor T2, so as to reset the pull-up node PU; the electric signal at the pull-up node PU is in a low level state and the third transistor T3 is turned off.

Since the fourth transistor T4 is turned on, the clock signal in the low level state is written to the signal output terminal OUTPUT through the fourth transistor T4 to perform the reset process on the signal output terminal OUTPUT, and the signal output terminal OUTPUT outputs a low level signal.

It should be noted that, the case where the shift register shown in FIG. 2 is driven by the timing sequence shown in FIG. 3 is only an optional driving solution in the present disclosure, which does not limit the technical solution of the present disclosure.

In practical applications, it is found that in the shift register shown in FIG. 2, since the pull-up node PU is in the floating state during the output stage S2, the voltage at the pull-up node PU is pulled up to an excessively high level under the bootstrap action of the first capacitor C1, and at this time, the third transistor T3 is in a "high-voltage" state, which easily results in a shortened service life of the third transistor T3.

Figure 4:
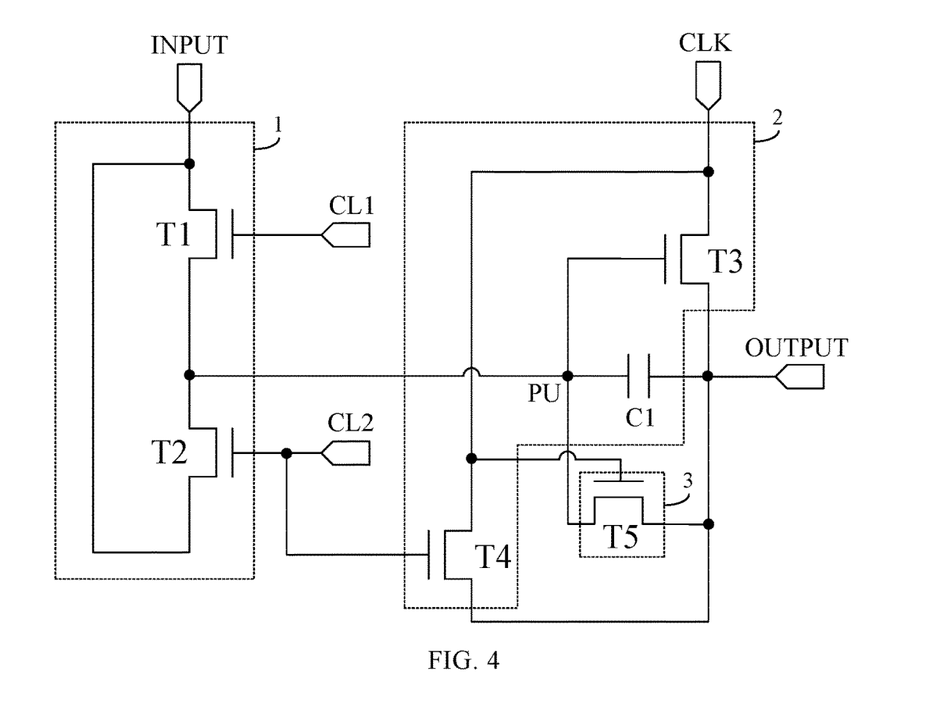
FIG. 4 is a further another schematic circuit diagram of a shift register according to an embodiment of the present disclosure.

In order to solve the above technical problem, an embodiment of the present disclosure provides another implementation of the shift register. FIG. 4 is another schematic circuit diagram of a shift register provided in an embodiment of the present disclosure, the shift register shown in FIG. 4 is a further improvement based on the shift register shown in FIG. 2. Unlike FIG. 2, the shift register shown in FIG. 4 further includes: a pull-up prevention circuit 3; the pull-up prevention circuit 3 is electrically coupled with the clock signal terminal CLK, the pull-up node PU and the signal output terminal OUTPUT, and the pull-up prevention circuit 3 is configured to electrically couple the pull-up node PU with the signal output terminal OUTPUT in response to the control of the electric signal in the active level state at the clock signal terminal during the output stage.

In some implementations, the pull-up prevention circuit 3 includes: a fifth transistor T5; a control electrode of the fifth transistor T5 is electrically coupled to the clock signal terminal CLK, a first electrode of the fifth transistor T5 is electrically coupled to the pull-up node PU, and a second electrode of the fifth transistor T5 is electrically coupled to the signal output terminal OUTPUT.

It should be noted that a specific structure of the pre-charge reset circuit 1 shown in FIG. 4 is not limited to the case shown in FIG. 2, and the pre-charge reset circuit 1 in this embodiment may adopt other structures, which may be specifically referred to in the following embodiments.

Figure 5:
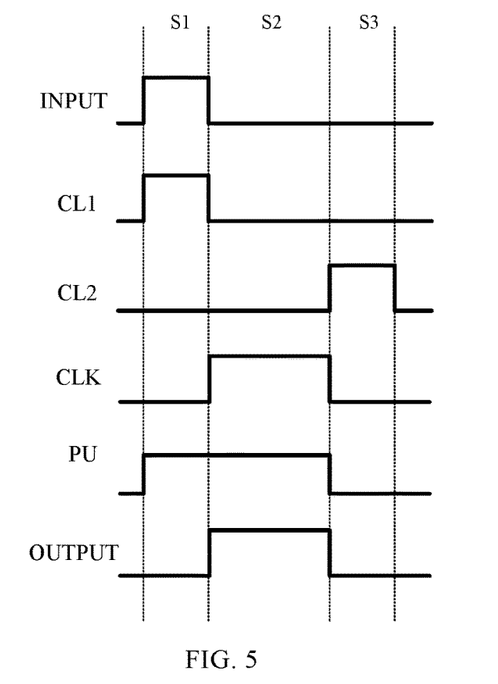
FIG. 5 is a timing diagram illustrating operation of the shift register shown in FIG. 4.

An operation of the shift register shown in FIG. 4 will be described in detail with reference to the accompanying drawings. FIG. 5 is a timing diagram illustrating an operation of the shift register shown in FIG. 4, and as shown in FIG. 5, an operation cycle of the shift register includes the following three stages: a pre-charge stage S1, an output stage S2, and a reset stage S3.

It should be noted that, in FIG. 4, specific operation processes of the pre-charge reset circuit 1 and the output circuit 2 in the three stages are the same as those in FIG. 2, and are not repeated herein; only specific operations of the pull-up prevention circuit 3 in the three stages will be described in detail below.

During the pre-charge stage S1, since the clock signal provided by the clock signal terminal CLK is in a low level stage, the fifth transistor T5 is turned off, and the pull-up node PU is decoupled from the signal output terminal OUTPUT.

During the output stage S2, since the clock signal provided by the clock signal terminal CLK is in a high level state, the fifth transistor T5 is turned on, the pull-up node PU is electrically coupled with the signal output terminal OUTPUT, and the voltage at the pull-up node PU is equal to the voltage of the signal output terminal OUTPUT at this time, that is, the pull-up node PU is not pulled up to a higher level by the first capacitor C1 during the output stage, so that the problem of shortened service life of the third transistor T3 due to being in a "high-voltage" state can be avoided.

During the reset stage S3, since the clock signal provided by the clock signal terminal CLK is in a low level state, the fifth transistor T5 is turned off, and the pull-up node PU is decoupled from the signal output terminal OUTPUT.

It should be noted that, the case where the shift register shown in FIG. 4 is driven by using the timing sequence shown in FIG. 5 is only an optional driving solution in the present disclosure, and does not limit the technical solution in the present disclosure.

Figure 6:
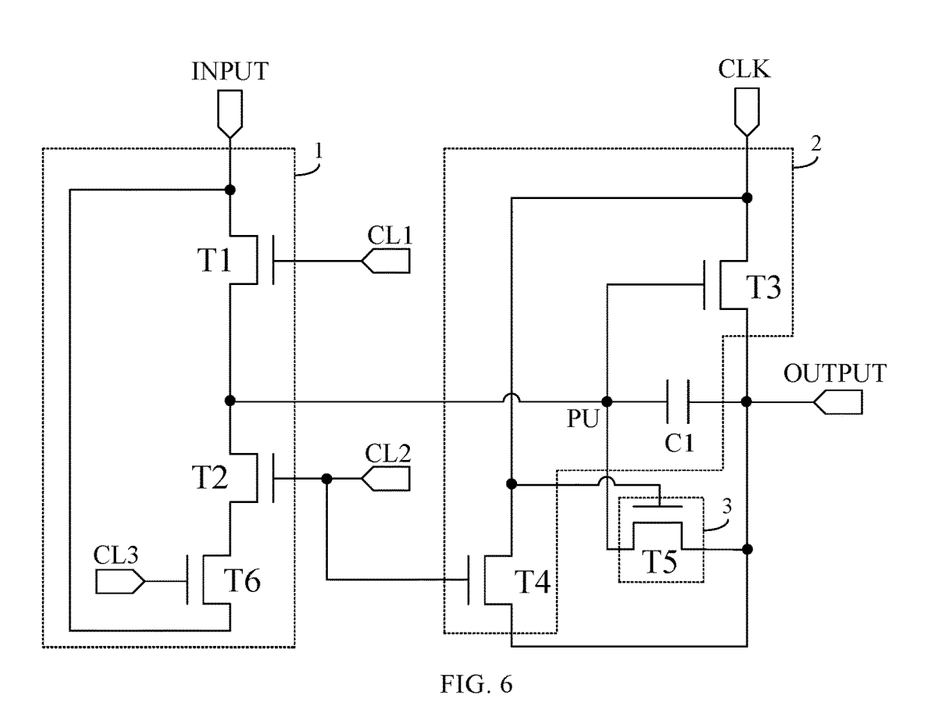
FIG. 6 is a yet another schematic circuit diagram of a shift register according to an embodiment of the present disclosure.

FIG. 6 is further another schematic circuit diagram of a shift register provided by an embodiment of the present disclosure, and as shown in FIG. 6, unlike those shown in FIG. 2 and FIG. 4, the pre-charge reset circuit 1 in the shift register provided by the present embodiment includes not only the first transistor T1 and the second transistor T2, but also a sixth transistor T6.

Specifically, a control electrode of the first transistor T1 is electrically coupled to the first control signal terminal CL1, a first electrode of the first transistor T1 is electrically coupled to the signal input terminal INPUT, and a second electrode of the first transistor T1 is electrically coupled to the pull-up node PU; a control electrode of the second transistor T2 is electrically coupled to the second control signal terminal CL2, a first electrode of the second transistor T2 is electrically coupled to the pull-up node PU, and a second electrode of the second transistor T2 is electrically coupled to a first electrode of the sixth transistor T6; a control electrode of the sixth transistor T6 is electrically coupled to a third control signal terminal CL3, and a second electrode of the third transistor T3 is electrically coupled to the signal input terminal INPUT.

Figure 7:
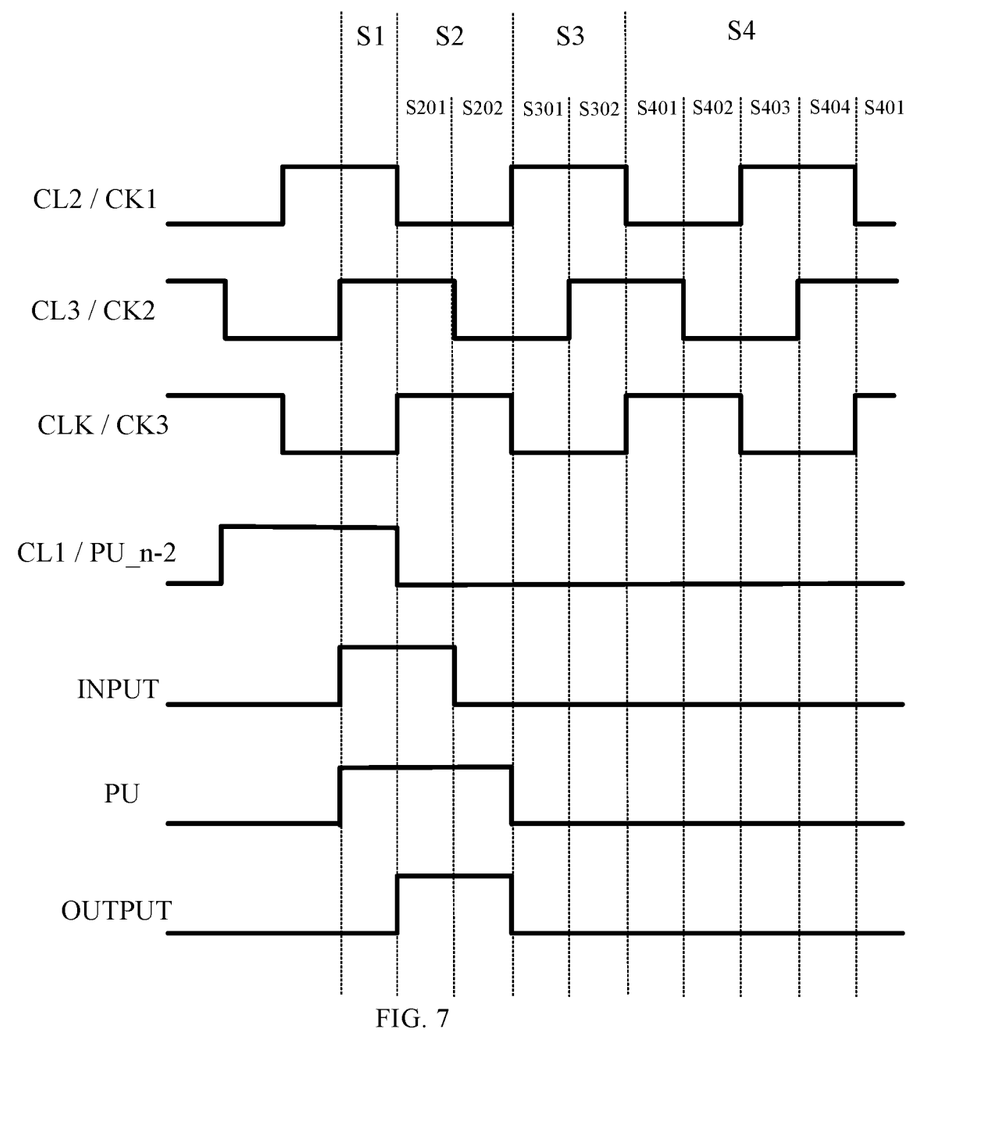
FIG. 7 is a timing diagram illustrating operation of the shift register shown in FIG. 6.

An operation of the shift register shown in FIG. 6 will be described in detail with reference to the accompanying drawings. FIG. 7 is a timing diagram of an operation of the shift register shown in FIG. 6. As shown in FIG. 7, for the shift register shown in FIG. 6, the first control signal terminal CL1 of the shift register is electrically coupled to a pull-up node PU_n−2 in a shift register that is of two stage prior to the shift register, and the second control signal terminal CL2, the third control signal terminal CL3 and the clock signal terminal CLK of the shift register are electrically coupled to three different clock signal lines, respectively.

For convenience of description, the three different clock signal lines are respectively referred to as a first clock signal line CK1, a second clock signal line CK2, and a third clock signal line CK3, the second control signal terminal CL2 is electrically coupled to the first clock signal line CK1, the third control signal terminal CL3 is electrically coupled to the second clock signal line CK2, and the clock signal terminal CLK is electrically coupled to the third clock signal line CK3. The first clock signal line CK1, the second clock signal line CK2, and the third clock signal line CK3 respectively provide a first clock signal, a second clock signal, and a third clock signal, periods of the first clock signal, the second clock signal, and the third clock signal are the same, duty ratios (a ratio of duration of a signal in an active level state in one period to the period) thereof each are 50%, the first clock signal is used as a reference, and timings when the second clock signal and the third clock signal are switched from the inactive level state to the active level state are sequentially delayed by T/4, where T is one period. At this time, waveforms of electrical signals provided by the second control signal terminal CL2, the third control signal terminal CL3, and the clock signal terminal CLK may be as shown in FIG. 7.

An operation period of the shift register includes the following four stages: a pre-charge stage S1, an output stage S2, a reset stage S3, and a sustain stage S4.

Figure 8A:
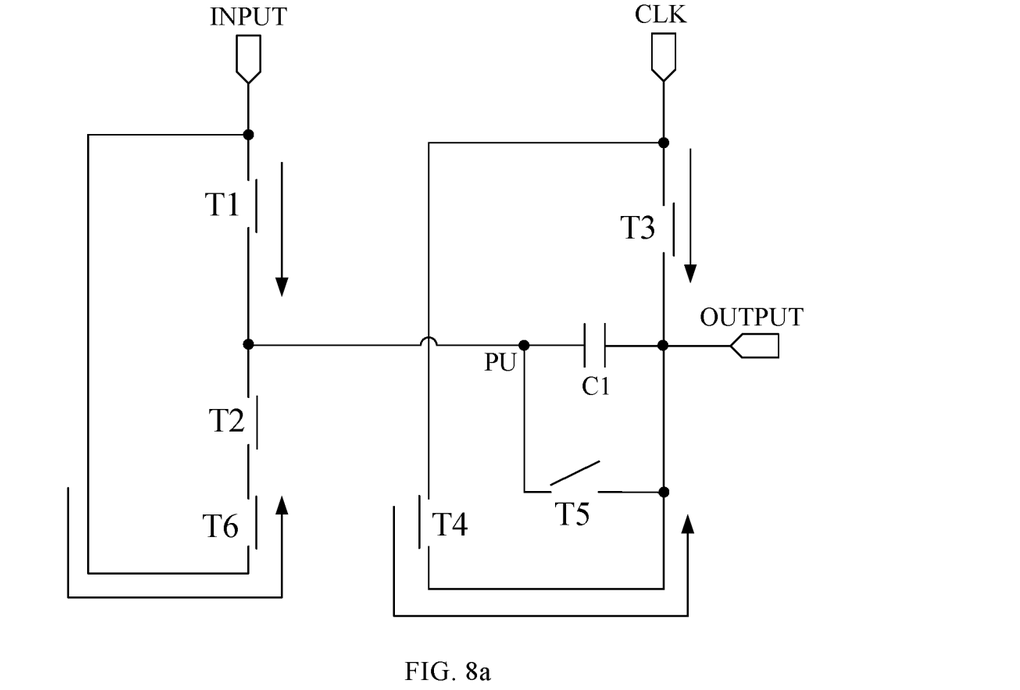
FIG. 8a is a schematic diagram of an equivalent circuit of the shift register shown in FIG. 6 driven by a timing sequence shown in FIG. 7 during a pre-charge stage.

FIG. 8a is a schematic diagram of an equivalent circuit of the shift register shown in FIG. 6 driven by the timing sequence shown in FIG. 7, and as shown in FIG. 8a, in the pre-charge stage S1, the input signal provided by the signal input terminal INPUT is in a high level state, the first control signal provided by the first control signal terminal CL1 (the electrical signal at the pull-up node PU_n−2 in a shift register that is of two stage prior to the current shift register) is in a high level state, the second control signal provided by the second control signal terminal CL2 (the first clock signal provided by the first clock signal line CK1) is in a high level state, the third control signal provided by the third control signal terminal CL3 (the second clock signal provided by the second clock signal line CK 2) is in a high level state, and the clock signal provided by the clock signal terminal CLK (the third clock signal provided by the third clock signal line CK3) is in a low level state. At this time, the first transistor T1, the second transistor T2, the third transistor T3, the fourth transistor T4, and the sixth transistor T6 are all turned on, and the fifth transistor T5 is turned off.

Since the first transistor T1 is turned on, the input signal in the high level state may be written to the pull-up node PU through the first transistor T1; meanwhile, since the second transistor T2 and the sixth transistor T6 are turned on, the input signal in the high level state may also be written to the pull-up node PU through the second transistor T2 and the sixth transistor T6, at this time, two branches simultaneously charge the pull-up node PU, and the voltage at the pull-up node PU can be charged to a high level state in a short time.

Since the electric signal at the pull-up node PU is in the high level state, the third transistor T3 is turned on, and the third clock signal in the low level state is written to the signal output terminal OUTPUT through the third transistor T3. Meanwhile, since the fourth transistor T4 is turned on, the third clock signal in the low level state is written to the signal output terminal OUTPUT through the fourth transistor T4, and at this time, the signal output terminal OUTPUT is charged by both branches at the same time.

Figure 8B:
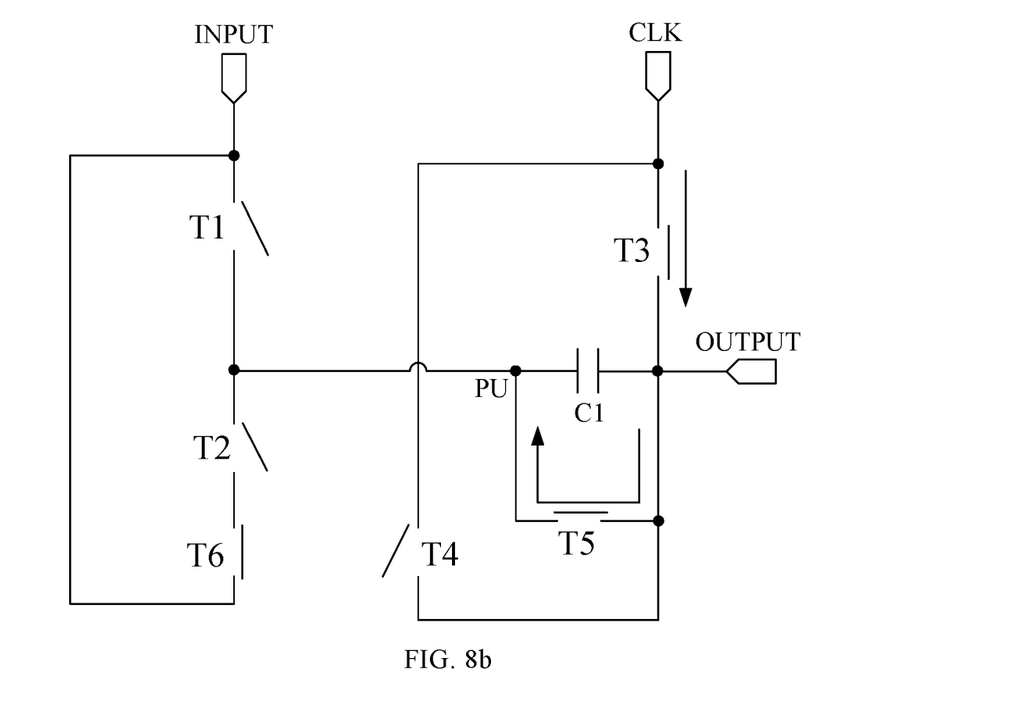
FIG. 8b is a schematic diagram of an equivalent circuit of the shift register shown in FIG. 6 driven by a timing sequence shown in FIG. 7 during a first output sub-stage.
Figure 8C:
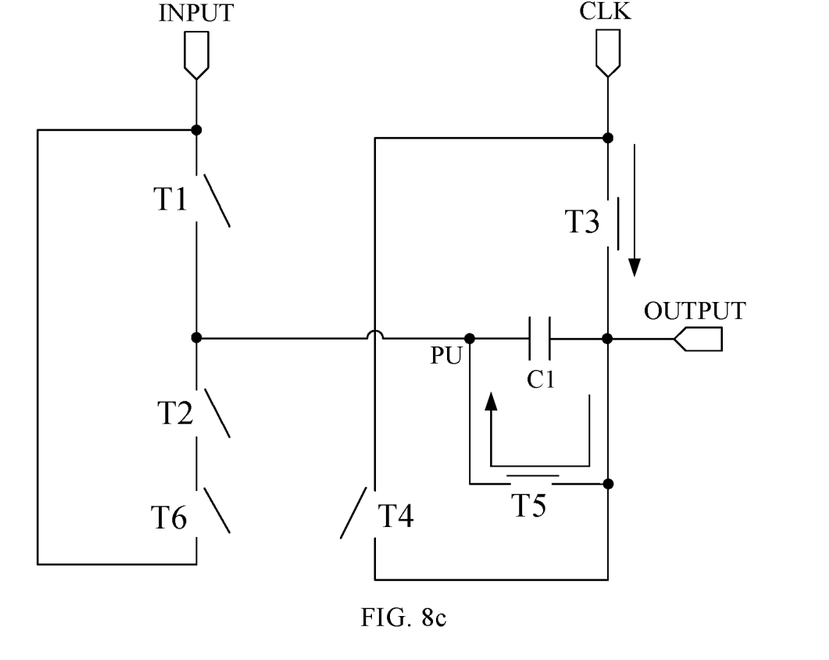
FIG. 8c is a schematic diagram of an equivalent circuit of the shift register shown in FIG. 6 driven by a timing sequence shown in FIG. 7 during a second output sub-stage.

FIG. 8b is a schematic diagram of an equivalent circuit of the shift register shown in FIG. 6 driven by the timing sequence shown in FIG. 7 and in a first output sub-stage, and FIG. 8c is a schematic diagram of an equivalent circuit of the shift register shown in FIG. 6 driven by the timing sequence shown in FIG. 7 and in a second output sub-stage, and as shown in FIG. 8b and FIG. 8c, the output stage S2 can be divided into a first output sub-stage 5201 and a second output sub-stage 5202.

Referring to FIG. 8b, in the first output sub-stage 5201, the input signal provided by the signal input terminal INPUT is in a high level state, the first control signal provided by the first control signal terminal CL1 (the electrical signal at the pull-up node PU_n−2 in a shift register that is of two stage prior to the current shift register) is in a low level state, the second control signal provided by the second control signal terminal CL2 (the first clock signal provided by the first clock signal line CK 1) is in a low level state, the third control signal provided by the third control signal terminal CL3 (the second clock signal provided by the second clock signal line CK2) is in a high level state, and the clock signal provided by the clock signal terminal CLK (the third clock signal provided by the third clock signal line CK3) is in a high level state. At this time, the third transistor T3, the fifth transistor T5, and the sixth transistor T6 are turned on, and the first transistor T1, the second transistor T2, and the fourth transistor T4 are turned off.

Since the third transistor T3 is turned on, the third clock signal in the high level state is written to the signal output terminal OUTPUT through the third transistor T3. Meanwhile, since the fifth transistor T5 is turned on, the electrical signal at the signal output terminal OUTPUT in the high level state is written to the pull-up node PU through the fifth transistor T5, and the pull-up node PU is not further pulled up by the first capacitor C1 because the pull-up node PU is not in a floating state at this time.

Referring to FIG. 8c, in the second output sub-stage 5202, the input signal provided by the signal input terminal INPUT is in a low level state, the first control signal provided by the first control signal terminal CL1 (the electrical signal at the pull-up node PU_n−2 in a shift register that is of two stage prior to the current shift register) is in a low level state, the second control signal provided by the second control signal terminal CL2 (the first clock signal provided by the first clock signal line CK1) is in a low level state, the third control signal provided by the third control signal terminal CL3 (the second clock signal provided by the second clock signal line CK2) is in a low level state, and the clock signal provided by the clock signal terminal CLK (the third clock signal provided by the third clock signal line CK3) is in a high level state. At this time, the third transistor T3 and the fifth transistor T5 are turned on, and the first transistor T1, the second transistor T2, the fourth transistor T4, and the sixth transistor T6 are turned off.

In the process of the second output sub-stage 5202, the pull-up node PU and the signal output terminal OUTPUT both maintain the state of the first output sub-stage.

Figure 8D:
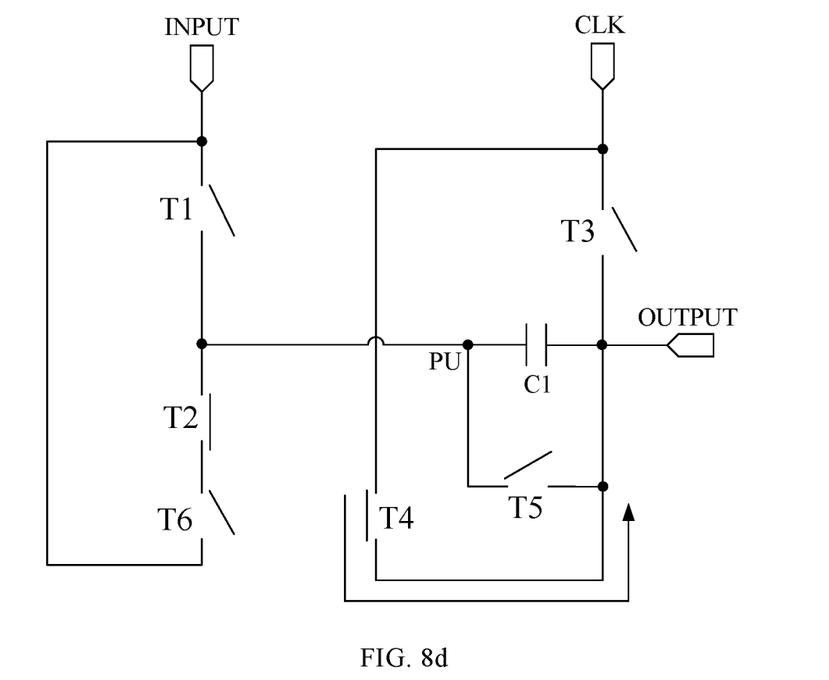
FIG. 8d is a schematic diagram of an equivalent circuit of the shift register shown in FIG. 6 driven by a timing sequence shown in FIG. 7 during a first reset stage.
Figure 8E:
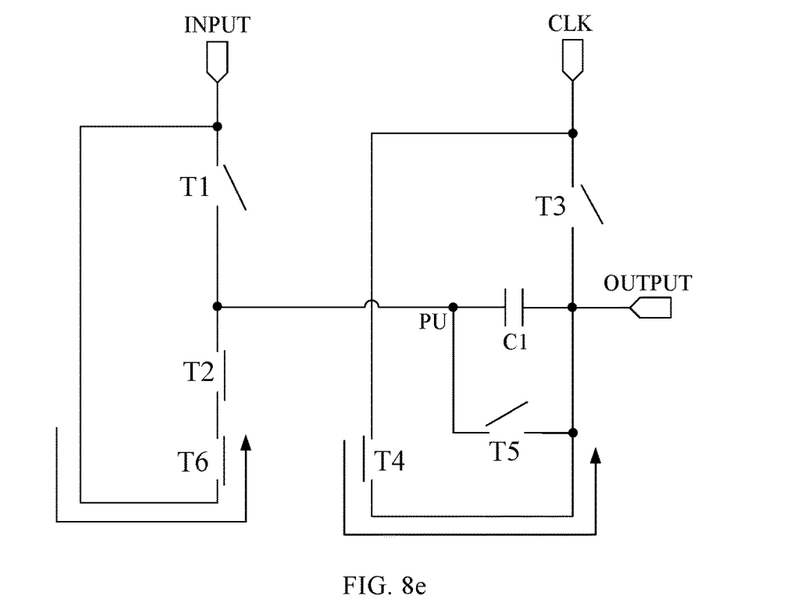
FIG. 8e is a schematic diagram of an equivalent circuit of the shift register shown in FIG. 6 driven by a timing sequence shown in FIG. 7 during a second reset stage.

FIG. 8d is a schematic diagram of an equivalent circuit of the shift register shown in FIG. 6 driven by the timing sequence shown in FIG. 7 and in a first reset sub-stage, and FIG. 8e is a schematic diagram of an equivalent circuit of the shift register shown in FIG. 6 driven by the timing sequence shown in FIG. 7 and in a second reset sub-stage, as shown in FIG. 8d and FIG. 8e, the reset stage S3 can be divided into the first reset sub-stage 5301 and the second reset sub-stage 5302.

Referring to FIG. 8d, in the first reset sub-stage 5301, the input signal provided by the signal input terminal INPUT is in a low level state, the first control signal provided by the first control signal terminal CL1 (the electrical signal at the pull-up node PU_n−2 in a shift register that is of two stage prior to the current shift register) is in a low level state, the second control signal provided by the second control signal terminal CL2 (the first clock signal provided by the first clock signal line CK1) is in a high level state, the third control signal provided by the third control signal terminal CL3 (the second clock signal provided by the second clock signal line CK 2) is in a low level state, and the clock signal provided by the clock signal terminal CLK (the third clock signal provided by the third clock signal line CK 3) is in a low level state. At this time, the second transistor T2 and the fourth transistor T4 are turned on, and the first transistor T1, the third transistor T3, the fifth transistor T5, and the sixth transistor T6 are turned off.

Since the first transistor T1, the fifth transistor T5, and the sixth transistor T6 are all turned off, the pull-up node PU is in a floating state; since the fourth transistor T4 is turned on, the third clock signal in the low level state is written to the signal output terminal OUTPUT through the fourth transistor T4, and the signal output from the signal output terminal OUTPUT is switched from a high level to a low level. At this time, since the pull-up node PU is in the floating state, the electric signal at the pull-up node PU is pulled down from the high level state to the low level state by the bootstrap of the first capacitor C1, so that the third transistor T3 is turned off.

Referring to FIG. 8e, in the second reset sub-stage 5302, the input signal provided by the signal input terminal INPUT is in a low level state, the first control signal provided by the first control signal terminal CL1 (the electrical signal at the pull-up node PU_n−2 in a shift register that is of two stage prior to the current shift register) is in a low level state, the second control signal provided by the second control signal terminal CL2 (the first clock signal provided by the first clock signal line CK1) is in a high level state, the third control signal provided by the third control signal terminal CL3 (the second clock signal provided by the second clock signal line CK2) is in a high level state, and the clock signal provided by the clock signal terminal CLK (the third clock signal provided by the third clock signal line CK3) is in a low level state. At this time, the second, fourth and sixth transistors T2, T4 and T6 are turned on, and the first, third and fifth transistors T1, T3 and T5 are turned off.

Since the second transistor T2 and the sixth transistor T6 are turned on, the input signal in the low level state is written to the pull-up node PU through the sixth transistor T6 and the second transistor T2 to maintain the pull-up node PU in the low level state.

Since the fourth transistor T4 is turned on, the third clock signal in the low state is written to the signal output terminal OUTPUT through the fourth transistor T4 to maintain the signal output terminal OUTPUT outputting the low level signal.

A time period from an end of the reset stage S3 to a beginning of the pre-charge stage of a next period is a sustain stage S4. The sustain stage S4 can be divided into a first sustain sub-stage 5401, a second sustain sub-stage 5402, a third sustain sub-stage 5403 and a fourth sustain sub-stage 5404, which are cyclically executed, and only the a portion of processes in the sustain sub-stages are described below.

During the first sustain sub-stage 5401 and the second sustain sub-stage 5402, although the third clock signal is in a high level state, since the third transistor T3 and the fourth transistor T4 are both turned off, the third clock signal in the high level state cannot be written into the signal output terminal OUTPUT, and thus the signal output terminal OUTPUT maintains the low level state in the first sustain sub-stage.

In the third sustain sub-stage 5403, the second transistor T2 and the fourth transistor T4 are turned on, and the third clock signal in the low level state at this time is written into the signal output terminal OUTPUT through the fourth transistor T4, so as to maintain the signal output terminal OUTPUT outputting the low level signal, thereby reducing noise of the signal output terminal OUTPUT.

In the fourth sustain sub-stage 5404, since the first clock signal and the second clock signal each are in a high level state, the second transistor T2, the fourth transistor T4 and the sixth transistor T6 are turned on, and the input signal in the low level state at this time is written into the pull-up node PU through the sixth transistor T6 and the second transistor T2, so as to maintain the pull-up node PU in the low level state, thereby reducing noise of the pull-up node PU; meanwhile, the third clock signal in the low level state is written into the signal output terminal OUTPUT through the fourth transistor T4 to maintain the signal output terminal OUTPUT outputting the low level signal, thereby reducing noise of the signal output terminal OUTPUT.

It should be noted that, the case where the shift register shown in FIG. 6 is driven by using the timing sequence shown in FIG. 7 is only an optional driving solution in the present disclosure, and does not limit the technical solution in the present disclosure.

An embodiment of the present disclosure further provides a gate driving circuit, where the gate driving circuit includes a plurality of shift registers which are cascaded, where each shift register adopts the shift register provided in the foregoing embodiment, and details of the specific structure of the shift register are not described here.

In the plurality of shift registers cascaded, except for the shift register of a first stage, for the shift register of any other stage, the signal input terminal of the shift register is electrically coupled with the signal output terminal of the shift register of a previous stage.

Figure 9:
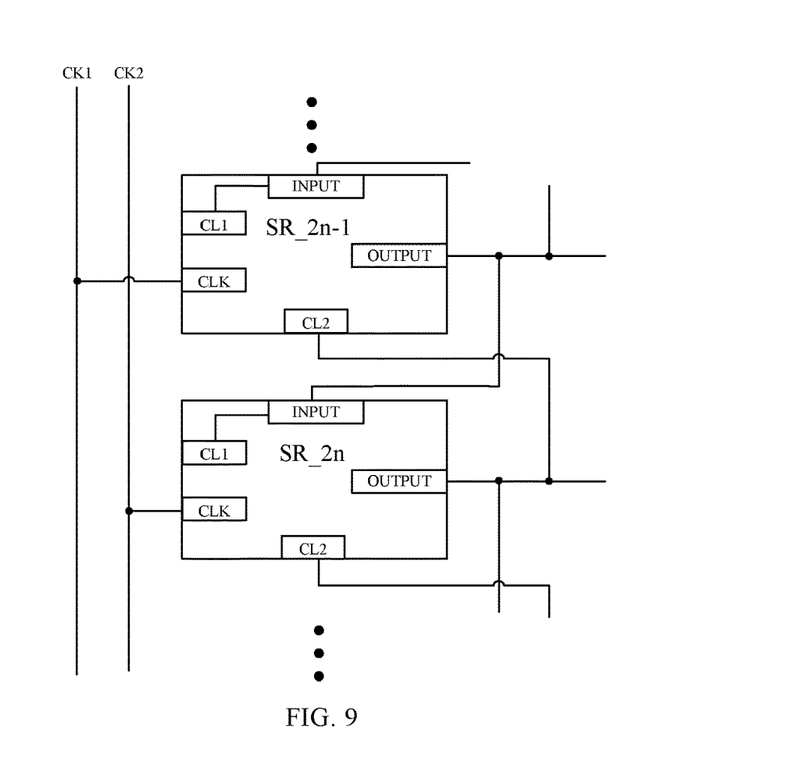
FIG. 9 is a schematic structural diagram of a gate driving circuit according to an embodiment of the present disclosure.

FIG. 9 is a schematic structural diagram of a gate driving circuit according to an embodiment of the present disclosure, and as shown in FIG. 9, in some implementations, in a case where the pre-charge reset circuit 1 in the shift register is as shown in FIG. 2 or FIG. 4 (that is, the pre-charge reset circuit 1 includes the first transistor T1 and the second transistor T2), two clock signal control lines (i.e., the first clock signal line CK1 and the second clock signal line CK2) are configured for the gate driving circuit.

For any shift register, the first control signal terminal CL1 of the shift register is electrically coupled to the signal input terminal INPUT of the shift register.

For any shift register rather than the shift register of the last stage, the second control signal terminal CL2 of the shift register is electrically coupled to the signal output terminal OUTPUT of the shift register of a next stage.

For any one of the shift registers SR_2n-1 of odd-numbered stages, the clock signal terminal CLK of the shift register SR_2n-1 is electrically coupled to the first clock signal line CK1.

For any one of the shift registers SR_2n of even-numbered stages, the clock signal terminal CLK of the shift register SR_2n is electrically coupled to the second clock signal line CK2.

Figure 10:
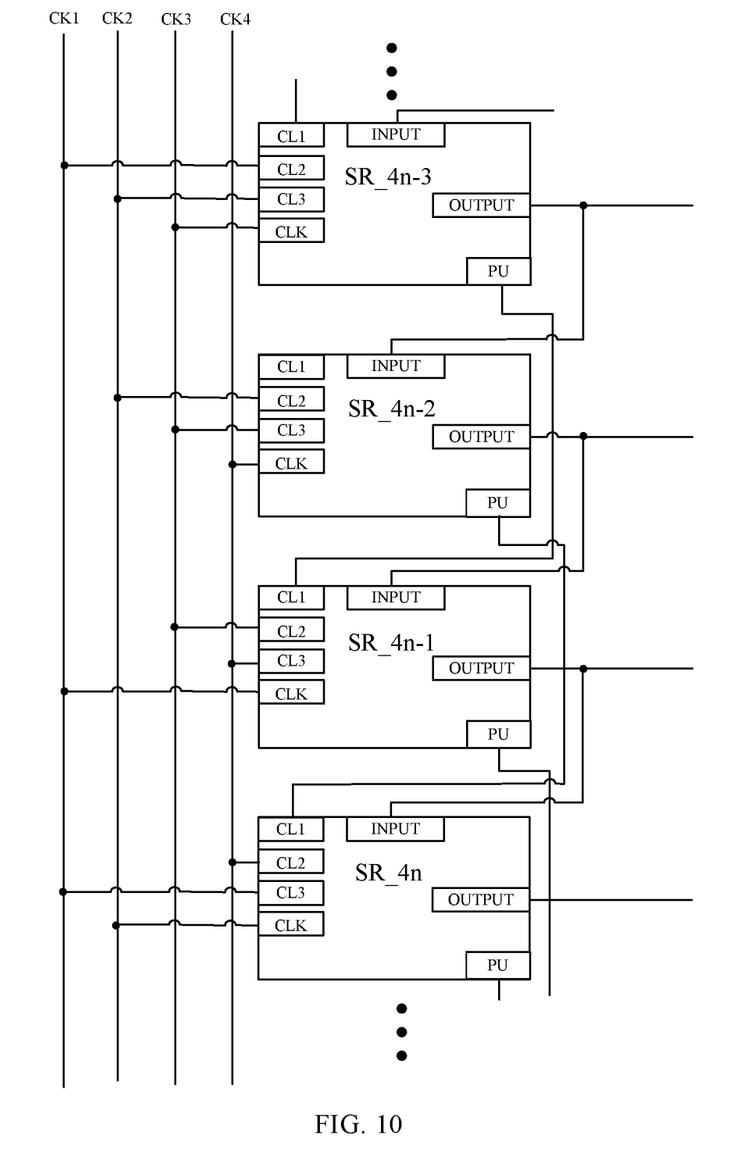
FIG. 10 is another schematic structural diagram of a gate driving circuit according to an embodiment of the present disclosure.

FIG. 10 is another schematic structural diagram of a gate driving circuit according to an embodiment of the present disclosure, and as shown in FIG. 10, in some implementations, in a case where the pre-charge reset circuit 1 in the shift register is as shown in FIG. 6 (that is, the pre-charge reset circuit 1 includes the first transistor T1, the second transistor T2 and the sixth transistor T6), four clock signal control lines (i.e., the first clock signal line CK1, the second clock signal line CK2, the third clock signal line CK3, and a fourth clock signal line CK4) are configured for the gate driving circuit.

In this embodiment, it is assumed that the number of shift registers is 4N, where N is a preset positive integer.

For any shift register rather than the shift register of the first stage and the shift register of the second stage, the first control signal terminal CL1 of the shift register is electrically coupled to the pull-up node PU of a shift register that is of two stage prior to the current shift register.

For any one of the shift registers SR_4n-3 of the (4n-3)$^{th}$ stages, the second control signal terminal CL2 of the shift register SR_4n-3 is electrically coupled to the first clock signal line CLK1, the third control signal terminal CL3 of the shift register SR_4n-3 is electrically coupled to the second clock signal line CLK2, and the clock signal terminal CLK of the shift register SR_4n-3 is electrically coupled to the third clock signal line CLK 3, where n is a positive integer less than or equal to N.

For any one of the shift registers SR_4n-2 of the (4n-2)$^{th}$ stages, the second control signal terminal CL2 of the shift register SR_4n-2 is electrically coupled to the second clock signal line CK2, the third control signal terminal CL3 of the shift register SR_4n-2 is electrically coupled to the third clock signal line CK3, and the clock signal terminal CLK of the shift register SR_4n-2 is electrically coupled to the fourth clock signal line CK4.

For any one of the shift registers SR_4n-1 of the (4n-1)$^{th}$ stages, the second control signal terminal CL2 of the shift register SR_4n-1 is electrically coupled to the third clock signal line CK3, the third control signal terminal CL3 of the shift register SR_4n-1 is electrically coupled to the fourth clock signal line CK4, and the clock signal terminal CLK of the shift register SR_4n-1 is electrically coupled to the first clock signal line CK1.

For any one of the shift registers SR_4n of the 4n$^{th}$ stages, the second control signal terminal CL2 of the shift register SR_4n is electrically coupled to the fourth clock signal line CK4, the third control signal terminal CL3 of the shift register SR_4n is electrically coupled to the first clock signal line CK1, and the clock signal terminal CLK of the shift register SR_4n is electrically coupled to the second clock signal line CK2.

The first clock signal line CK1, the second clock signal line CK2, the third clock signal line CK3, and the fourth clock signal line CK4 supply a first clock signal, a second clock signal, a third clock signal, and a fourth clock signal, respectively. In the process that the gate driving circuit drives each gate line in the display panel, periods of the first clock signal, the second clock signal, the third clock signal and the fourth clock signal are the same, duty ratios of the first clock signal, the second clock signal, the third clock signal and the fourth clock signal each are 50%, the first clock signal is used as a reference, and timings when the second clock signal, the third clock signal and the fourth clock signal are switched from the inactive level state to the active level state are sequentially delayed by T/4, where T is one period.

An embodiment of the present disclosure further provides a display device, which includes a gate driving circuit, where the gate driving circuit may adopt the gate driving circuit provided in the foregoing embodiment, and details of the structure of the gate driving circuit are not described herein.

It should be noted that, the display device in the present disclosure may be any product or component with a display function, such as a liquid crystal panel, electronic paper, an OLED panel, a mobile phone, a tablet computer, a television, a display, a notebook computer, a digital photo frame, a navigator and the like.

Figure 11:
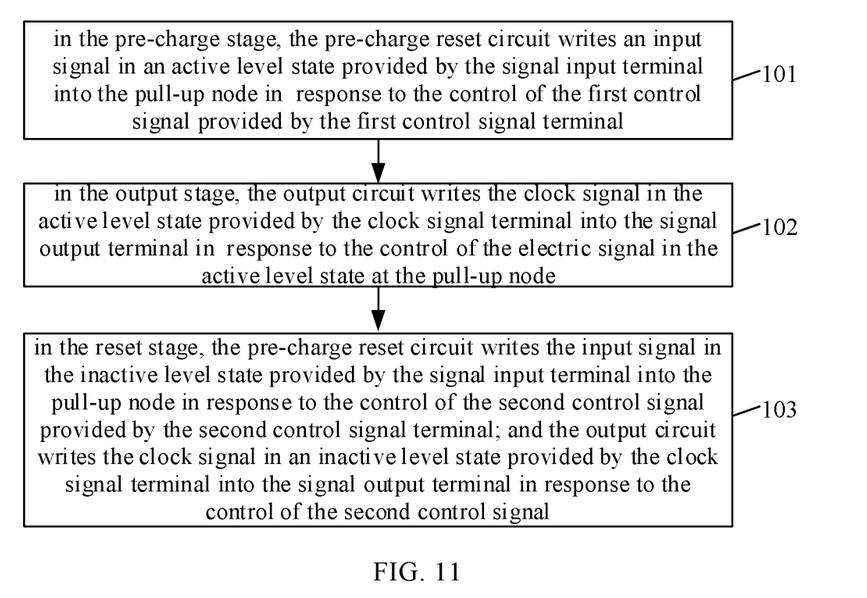
FIG. 11 is a flowchart of a gate driving method according to an embodiment of the present disclosure.

FIG. 11 is a flowchart of a gate driving method provided in an embodiment of the present disclosure, and as shown in FIG. 11, the gate driving method is based on the shift register provided in the foregoing embodiment, and the gate driving method includes following steps 101 to 103.

Step 101, in the pre-charge stage, the pre-charge reset circuit writes the input signal in the active level state provided by the signal input terminal to the pull-up node in response to the control of the first control signal provided by the first control signal terminal.

Step 102, in the output stage, the output circuit writes the clock signal in the active level state provided by the clock signal terminal into the signal output terminal in response to the control of the electric signal in the active level state at the pull-up node.

Step 103, in the reset stage, the pre-charge reset circuit writes the input signal in the inactive level state provided by the signal input terminal into the pull-up node in response to the control of the second control signal provided by the second control signal terminal; the output circuit writes the clock signal in the inactive level state provided by the clock signal terminal to the signal output terminal in response to the control of the second control signal.

For the specific description of step 101 to step 103, reference may be made to the related contents of the foregoing description on the shift register, and details are not repeated here.

It will be understood that the above embodiments are merely exemplary embodiments employed to illustrate principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A shift register, comprising: a pre-charge reset circuit and an output circuit which are electrically coupled to a pull-up node;
  the pre-charge reset circuit is electrically coupled with a signal input terminal, a first control signal terminal and a second control signal terminal, and is configured to write, in a pre-charge stage, an input signal in an active level state provided by the signal input terminal into the pull-up node in response to the control of a first control signal provided by the first control signal terminal, and write, in a reset stage, an input signal in an inactive level state provided by the signal input terminal into the pull-up node in response to the control of a second control signal provided by the second control signal terminal;
  the output circuit is electrically coupled with a signal output terminal, a clock signal terminal and the second control signal terminal, and is configured to write, in an output stage, a clock signal in an active level state provided by the clock signal terminal into the signal output terminal in response to the control of an electric signal in an active level state at the pull-up node, and write, in the reset stage, a clock signal in an inactive level state provided by the clock signal terminal into the signal output terminal in response to the control of the second control signal, wherein
  the pre-charge reset circuit comprises: a first transistor and a second transistor, a control electrode of the first transistor is electrically coupled with the first control signal terminal, a first electrode of the first transistor is electrically coupled with the signal input terminal, and a second electrode of the first transistor is electrically coupled with the pull-up node; a control electrode of the second transistor is electrically coupled with the second control signal terminal, a first electrode of the second transistor is electrically coupled with the pull-up node, and a second electrode of the second transistor is electrically coupled with the signal input terminal;
  the output circuit comprises: a third transistor, a fourth transistor and a first capacitor, a control electrode of the third transistor is electrically coupled with the pull-up node, a first electrode of the third transistor is electrically coupled with the clock signal terminal, and a second electrode of the third transistor is electrically coupled with the signal output terminal; a control electrode of the fourth transistor is electrically coupled with the second control signal terminal, a first electrode of the fourth transistor is electrically coupled with the clock signal terminal, and a second electrode of the fourth transistor is electrically coupled with the signal output terminal; a first terminal of the first capacitor is electrically coupled with the signal output terminal, and a second terminal of the first capacitor is electrically coupled with the pull-up node;
  the first control signal terminal is electrically coupled to pull-up node of another shift register;
  the second control signal terminal is configured to provide a first clock signal; and
  the clock signal terminal is configured to provide a third clock signal.

2. The shift register of claim 1, wherein the pre-charge reset circuit further comprises: a sixth transistor, a control electrode of the sixth transistor is electrically coupled with a third control signal terminal, a first electrode of the sixth transistor is electrically coupled with the second electrode of the second transistor, and a second electrode of the sixth transistor is electrically coupled with the signal input terminal.

3. The shift register of claim 1, further comprising a pull-up prevention circuit, wherein
  the pull-up prevention circuit is electrically coupled with the clock signal terminal, the pull-up node and the signal output terminal and is configured to electrically couple, in the output stage, the pull-up node with the signal output terminal in response to the control of an electric signal of the clock signal terminal in an active level state.

4. The shift register of claim 3, wherein the pull-up prevention circuit comprises a fifth transistor, wherein
  a control electrode of the fifth transistor is electrically coupled with the clock signal terminal, a first electrode of the fifth transistor is electrically coupled with the pull-up node, and a second electrode of the fifth transistor is electrically coupled with the signal output terminal.

5. The shift register of claim 1, wherein all transistors in the shift register are N-type transistors; or all transistors in the shift register are P-type transistors.

6. A gate driving circuit comprising: a plurality of shift registers which are cascaded, each of the shift registers adopts the shift register of claim 1, wherein
  for any one of the shift registers rather than the shift register of the first stage, the signal input terminal of the shift register is electrically coupled with the signal output terminal of a shift register of a previous stage.

7. The gate driving circuit of claim 6, wherein the pre-charge reset circuit comprises: a first transistor and a second transistor; a control electrode of the first transistor is electrically coupled with the first control signal terminal, a first electrode of the first transistor is electrically coupled with the signal input terminal, and a second electrode of the first transistor is electrically coupled with the pull-up node; a control electrode of the second transistor is electrically coupled with the second control signal terminal, a first electrode of the second transistor is electrically coupled with the pull-up node, and a second electrode of the second transistor is electrically coupled with the signal input terminal, the gate driving circuit has a first clock signal line and a second clock signal line, and wherein
  for any one of the shift registers, the first control signal terminal of the shift register is electrically coupled with the signal input terminal of the shift register;
  for any one of shift registers other than the shift register of the last stage, the second control signal terminal of the shift register is electrically coupled with the signal output terminal of a shift register of a next stage;
  for any one of shift registers of odd-numbered stages, the clock signal terminal of the shift register is electrically coupled with the first clock signal line;

for any one of shift registers of even-numbered stages, the clock signal terminal of the shift register is electrically coupled with the second clock signal line.

8. A display device, comprising: a gate driving circuit of claim 7.

9. The gate driving circuit of claim 6, wherein when the pre-charge reset circuit comprises: a first transistor, a second transistor, and a sixth transistor; a control electrode of the first transistor is electrically coupled with the first control signal terminal, a first electrode of the first transistor is electrically coupled with the signal input terminal, and a second electrode of the first transistor is electrically coupled with the pull-up node; a control electrode of the second transistor is electrically coupled with the second control signal terminal, a first electrode of the second transistor is electrically coupled with the pull-up node, and a second electrode of the second transistor is electrically coupled with a first electrode of the sixth transistor; a control electrode of the sixth transistor is electrically coupled with a third control signal terminal, and a second electrode of the sixth transistor is electrically coupled with the signal input terminal, the gate driving circuit has a first clock signal line, a second clock signal line, a third clock signal line, and a fourth clock signal line, and wherein for any one of shift registers other than the shift register of the first stage and the shift register of the second stage, the first control signal terminal of the shift register is electrically coupled with the pull-up node in a shift register that is of two stage prior to the current shift register;

for any one of shift registers of $(4n-3)^{th}$ stages, the second control signal terminal of the shift register is electrically coupled to the first clock signal line, the third control signal terminal of the shift register is electrically coupled to the second clock signal line, and the clock signal terminal of the shift register is electrically coupled with the third clock signal line;

for any one of shift registers of $(4n-2)^{th}$ stages, the second control signal terminal of the shift register is electrically coupled with the second clock signal line, the third control signal terminal of the shift register is electrically coupled with the third clock signal line, and the clock signal terminal of the shift register is electrically coupled with the fourth clock signal line;

for any one of shift registers of $(4n-1)^{th}$ stages, the second control signal terminal of the shift register is electrically coupled with the third clock signal line, the third control signal terminal of the shift register is electrically coupled with the fourth clock signal line, and the clock signal terminal of the shift register is electrically coupled with the first clock signal line;

for any one of shift registers of $(4n)^{th}$ stages, the second control signal terminal of the shift register is electrically coupled to the fourth clock signal line, the third control signal terminal of the shift register is electrically coupled to the first clock signal line, and the clock signal terminal of the shift register is electrically coupled with the second clock signal line.

10. A display device, comprising: a gate driving circuit of claim 6.

11. A gate driving method based on the shift register of claim 1, comprising:

in the pre-charge stage, the first control signal provided by the first control signal terminal is in an active level state, the first clock signal provided by the second control signal terminal is in an inactive level state, the third clock signal provided by the clock signal terminal is in an inactive level state, the pre-charge reset circuit writes an input signal in an active level state provided by the signal input terminal into the pull-up node in response to the control of the first control signal;

in the output stage, the first control signal is in an inactive level state, the first clock signal is in an inactive level state, the third clock signal is in an active level state, the output circuit writes the clock signal in the active level state provided by the clock signal terminal into the signal output terminal in response to the control of the third clock signal at the pull-up node; and in the reset stage, the first control signal is in an inactive level state, the first clock signal is in an active level state, the third clock signal is in an inactive level state, the pre-charge reset circuit writes the input signal in the inactive level state provided by the signal input terminal into the pull-up node in response to the control of the first clock signal; and the output circuit writes the clock signal in an inactive level state provided by the clock signal terminal into the signal output terminal in response to the control of the first clock signal.

* * * * *